United States Patent [19]

Snail

[11] Patent Number: 5,174,983
[45] Date of Patent: Dec. 29, 1992

[54] FLAME OR PLASMA SYNTHESIS OF DIAMOND UNDER TURBULENT AND TRANSITION FLOW CONDITIONS

[75] Inventor: Keith A. Snail, Silver Spring, Md.

[73] Assignee: The United States of America, as represented by the Secretary of the Navy, Washington, D.C.

[21] Appl. No.: 587,328

[22] Filed: Sep. 24, 1990

[51] Int. Cl.$^5$ .................. C01B 31/00; C23C 16/26
[52] U.S. Cl. .................. 423/446; 156/DIG. 68; 427/249
[58] Field of Search .................. 423/446; 427/249; 156/DIG. 68; 204/157.47

[56] References Cited

U.S. PATENT DOCUMENTS

| | | | |
|---|---|---|---|
| 4,191,735 | 3/1980 | Nelson et al. | 423/446 |
| 4,859,493 | 8/1989 | Lemelson | 423/446 |
| 4,938,940 | 7/1990 | Hirose et al. | 423/446 |
| 4,958,590 | 9/1990 | Goforth | 423/446 |

FOREIGN PATENT DOCUMENTS

| | | | |
|---|---|---|---|
| 286306 | 10/1988 | European Pat. Off. | 423/446 |
| 164795 | 6/1989 | Japan | 423/446 |

OTHER PUBLICATIONS

Angus and Hayman; "Low Pressure, Metastable Growth of Diamond and 'Diamondlike' Phases"; Aug. 1988 pp. 913-921.
Ohtake and Yoshikawa; "Diamond Film Preparation by ARC Discharge Plasma Jet Chemical Vapor Deposition in the Methane Atmosphere" 1990 pp. 718-722.
Hanssen, et al. "Diamond Synthesis Using an Oxygen-Acetylene Torch"; Dec. 1988 pp. 289-292.
Frisch and Orszag; "Turbulence: Challenges for Theory and Experiment" Jan. 1990; pp. 24-32.
Hirose, et al. "The Synthesis of High Quality Diamond in Combustion Flame" pp. 80-92.
Hirose and Terasawa; "Synthesis of Diamond Thin Films by Thermal CVD Using Organic Compounds" May 1986 pp. L519-L521.
Koshino, et al.; "High-Rate Synthesis of Diamond Film by DC Plasma Jet CVD" 95-98.
Hirose and Kondo; "Synthesis of Diamond Using Combustion Flame"; Mar. 1988 p. 434.
Hirose and Mitsuizumi; "Diamond Synthesis in Air by Using Flame" Aug. 1988; pp. 34-35.
Bird, Stewart and Lightfoot; "Transport Phenomena-Velocity Distributions in Turbulent Flow" pp. 153-156.
Matsumoto, Hino and Kobayashi; "Synthesis of Diamond Films in a RF Induction Thermal Plasma" Sep. 1987 pp. 737-739.
Cappelli, Owano and Kruger; "High Growth Rate Diamond Synthesis in a Large Area Atmospheric Pressure Inductively Coupled Plasma" Nov. 1990 pp. 1-16.
McGraw Hill Encyclopedia of Science & Technology vol. 7, 1992, p. 194.
McGraw Hill Dictionary of Scientific and Technical Terms, 3rd ed. 1984, p. 1068.

Primary Examiner—Michael Lewis
Assistant Examiner—Stephen Kalinchak

[57] ABSTRACT

A method for synthesizing diamond which comprises flowing together a gaseous carbon source and a gaseous hydrogen source to form an at least partially turbulent mixture. The at least partially turbulent mixture is excited to form an at least partially turbulent reactive species which is reacted to form a deposition species. A substrate is disposed in the deposition species while maintaining the substrate at a temperature for the deposition of diamond, thereby inducing deposition of diamond on the substrate.

22 Claims, 10 Drawing Sheets

FLAME OR PLASMA SYNTHESIS OF DIAMOND UNDER TURBULENT AND TRANSITION FLOW CONDITIONS

BACKGROUND OF THE INVENTION

1. Field of the Invention

This invention relates to a method for the chemical vapor deposition of high quality diamond on a substrate and the diamond so produced.

2. Description of the Prior Art

Diamond synthesis at low pressures (1-100 Torr) by chemical vapor deposition (CVD) using hydrocarbon gases mixed with Hz has been the subject of expanding interest and investigation over the last two decades (see, for example, J. C. Angus and C. C. Hayman, Science 241 (1988) 913). Recently, the addition of oxygen-containing gases to the process was found to increase the maximum deposition rates of 1 $\mu$m/h by an order of magnitude (see Y. Hirose and Y. Terasawa, Japan. J. Appl. Phys. 2 (1986) L.519 and J. A. Mucha, D. L. Flamm and D. E. Ibbotson, Program and Book of Abstracts, SDIO/1st-ONR Diamond Technology Initiative Symposium, 12-14 July, 1988, Crystal City, Va.). In addition, the application of plasma jets running at high temperatures and flow rates to the CVD process has yield growth rates of up to 180 $\mu$m/h (see N. Koshino, K. Kurihara, M. Kawarada and K. Sasaki, Extended Book of Abstracts, MRS Conference on Diamond and Diamond-like Materials Synthesis, Reno, Nev., April 1988, p. 434, and more recently 960 $\mu$m/h by Ohtake et al., "Diamond Film Preparation by Arc Discharge Plasma Jet Chemical Vapor Deposition in the Methane Atmosphere", Journal of the Electrochemical Society, Vol. 137, No. 2, February 1990).

Hirose and Kondo have reported growth of diamond polycrystalline films using oxygen-acetylene flames with growth rates approaching 100 $\mu$m/h (see Y. Hirose and N. Kondo, Program and Book of Abstracts, Japan Applied Physics 1988 Spring Meeting, Mar. 29, 1988). Since then, Hirose and Mitsuizumi have reported the growth of diamond with acetylene, ethylene, methane, propane, methanol and ethanol gases burned in air when mixed with either hydrogen or oxygen (see Y. Hirose and M. Mitsuizumi, New Diamond 4, 34 (1988)). Growth was achieved on Si, SiC, $Al_2O_3$, W, WC, and Mo substrates in an oxygen-acetylene flame, and rates of 200 $\mu$m/hr for particle growth were reported. Subsequently, Hanssen et al. ("Diamond and non-diamond carbon synthesis in an oxygen-acetylene flame", accepted for publication in Thin Solid Films, June 1990, and the entirety of which is incorporated by reference herein) studied the effect of substrate position, gas flow ratio, and substrate temperature on diamond growth in an oxygen-acetylene flame, and observed growth on Si(100), Si(111), BN, Mo(100), Nb(100), TiC(100), Ta and Cu. Carrington et al. (Materials Letters, Vol. 7, No. 7,8, December 1988, pages 289-292, the entirety of which is incorporated herein by reference) have reported growth on Si(100) in oxygen-ethylene flame. More recently, Hirose et al. (ECS Proc. Vol 89-12, p. 80, May 7-12, the entirety of which is incorporated herein by reference) have reported on the growth of high quality diamond crystals in a flame at substrate temperatures of 500° to 700° C. The quality of these crystals was determined by their transparency under an optical microscope, and their Raman and x-ray diffraction spectra.

Notwithstanding these developments, there exists a need in the art for processes for producing diamonds of greater uniformity and higher quality.

SUMMARY OF THE INVENTION

Therefore, it is an object of the invention to synthesize high quality diamond crystals and films uniformly over large areas, under controlled conditions.

This and other objects of the invention are accomplished by a method for synthesizing diamond which comprises flowing together a gaseous carbon source and a gaseous hydrogen source to form a turbulent mixture. This turbulent mixture is excited to form a turbulent reactive species which is reacted to form a deposition species. A substrate is disposed in the deposition species while maintaining the substrate at a temperature for the deposition of diamond, thereby inducing deposition of diamond on the substrate.

Other features and advantages of the invention will be set forth in, or apparent from, the detailed description of preferred embodiments of the invention which follows.

DETAILED DESCRIPTION OF THE PREFERRED EMBODIMENTS

The carbon sources which may be used in the chemical vapor deposition of diamond include but are not limited the following compounds which also function as sources for hydrogen:

Saturated hydrocarbons: methane, ethane, propane, butane, etc.

Unsaturated hydrocarbons: Ethylene, propylene, butylene, acetylene, etc.

Aromatic hydrocarbons: Benzene, toluene, xylene, cyclohexane, etc.

CHO compounds: Alcohols such as methanol, ethanol, propanol, butanol, ether group containing compounds.

Ketone group-containing compounds: Acetone, methyl ethyl ketone, diethyl ketone, 2,4-pentanedione, and 1'-butyronaphthone.

Esters: Methyl acetate, ethyl acetate, and isoamyl acetate.

Ketene group-containing compounds: Dimethyl ketene and phenyl ketene.

Acetyl group-containing compounds: Acetic acid, acetic anhydride, acetophenone, and biacetyl.

Aldehyde group-containing compounds: Formaldehyde, acetaldehyde and propionaldehyde.

Methylene group-containing compounds: Ketene and diazo methane.

Methyl group-containing compounds: t-Butyl peroxide, methyl hydroxperoxide, and peracetic acid.

The compounds listed above can be used either singly or in combinations of two or more. Further, although the carbon and hydrogen sources listed above are the same gas, it is possible to use separate carbon and hydrogen sources in the turbulent mixture of gases, as well as diluents such as Argon, Xenon, etc.

Various types of chemical vapor deposition (CVD) techniques may be employed with the above carbon and hydrogen sources in practicing the invention. Such techniques include combustion flame deposition, radio frequency (RF) plasma jet deposition and direct current (DC) plasma jet deposition. For combustion flame deposition, a carbon source such as acetylene is preferable because it burns at a high temperature. However, when combustion flame deposition is used in combination with a microwave cavity or RF coil to excite the turbulent mixture of gases, it is possible to use carbon and hydrogen sources which burn at a lower temperature.

For deposition of large highly thermally conductive single diamond crystals, preferred carbon sources include isotopically enriched $^{12}C$ methane, acetylene, or other hydrocarbons which yield diamond of a particularly high degree of purity.

The apparatus for synthesizing diamond using a turbulent or partially turbulent combustion flame technique typically includes a commercial oxygen-acetylene brazing torch, a mass flow control system, a supply of oxygen and acetylene, a substrate (e.g. Si, Mo, TiC, diamond, etc.), a device for controlling the temperature of the substrate, and a thermocouple or pyrometer for measuring the temperature of the substrate. A typical apparatus 10 incorporating these elements is illustrated in schematic form in FIG. 1.

Figure 1:
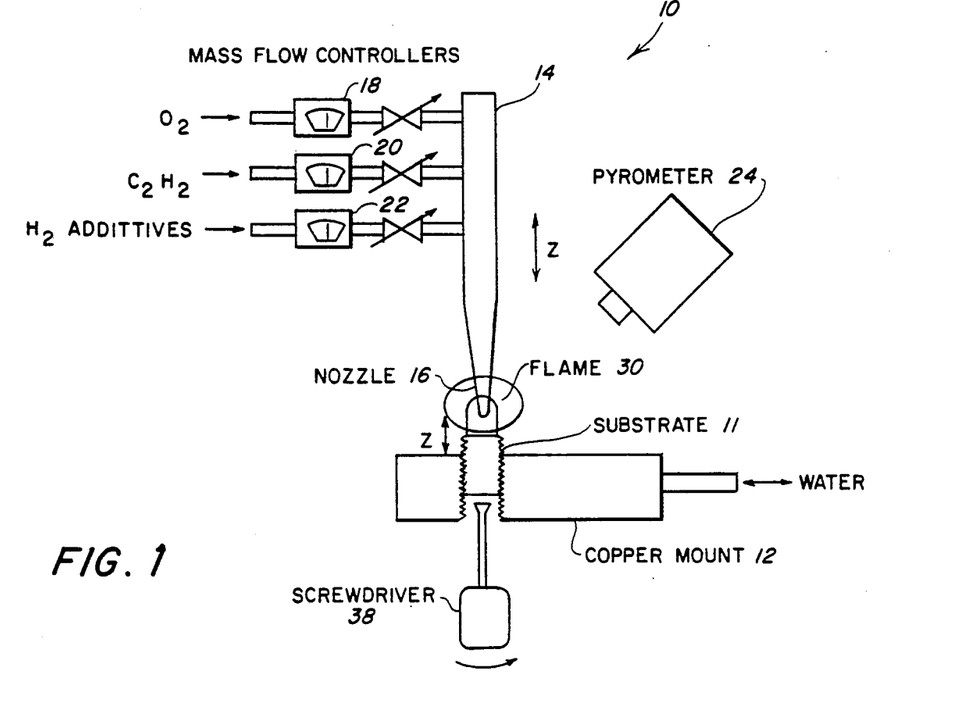
FIG. 1 illustrates in schematic form a combustion flame deposition apparatus for practicing the process according to the invention.

In apparatus 10, a substrate 11 is mounted on a water-cooled copper block mount 12. An oxygen-acetylene welding torch 14 is fitted with a brazing or cutting nozzle 16 in order to deposit diamond. A suitable welding torch has a size #4 tip. Mass flow controllers 18, 20 and 22 are used to measure gas flow rates and ratios. Welder's grade or high purity acetylene and 99.9% purity grade oxygen are preferably used as source gases. An activated charcoal trap or other suitable device may be used to remove acetone from the acetylene. The torch 14 is preferably mounted on an xyz translation stage for accurate and repeatable positioning. A two-color near-infrared pyrometer 24 is used to monitor substrate temperatures, T, which vary from about 300° C. to 1200° C. The pyrometer can be calibrated with a chromel/alumel thermocouple attached to a Si substrate heated in a tube furnace up to 1000° C. The temperature measuring device or pyrometer 24 should be insensitive to the flame emission The temperature of the substrate 11 is adjusted by rotating a screwdriver 38 which may be used to vary the degree of insertion of the substrate 11 in the copper mount 12.

Figure 1A:
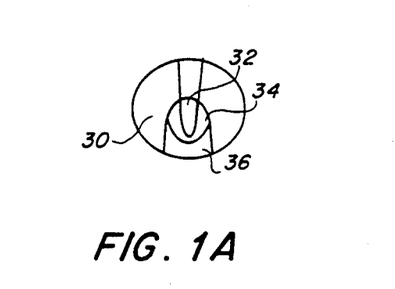
FIG. 1A illustrates in detail the circled region of FIG. 1.

A stationary oxygen-acetylene flame 30 is illustrated in FIG. 1A. Three regions are shown: an inside cone 32 bounded by the $O_2$-$C_2H_2$ flame front, an incomplete combustion region or $C_2H_2$ feather 34 where excess $C_2H_2$ burns with $O_2$, which diffuses into the flame from the surrounding air (the size of the feather is dependent on the gas flow ratio and only appears when the torch is run $C_2H_2$ rich); and outside flame 36 where the CO and $H_2$ produced on the inside cone burns to produce $CO_2$ and $H_2O$. The flame temperature at the inner cone 32 varies with the ratio, R, of $O_2$ to $C_2H_2$ gas flow from 3162° C. for a flame with R=1.5, to 2960° C. for R=0.8.

Figure 2:
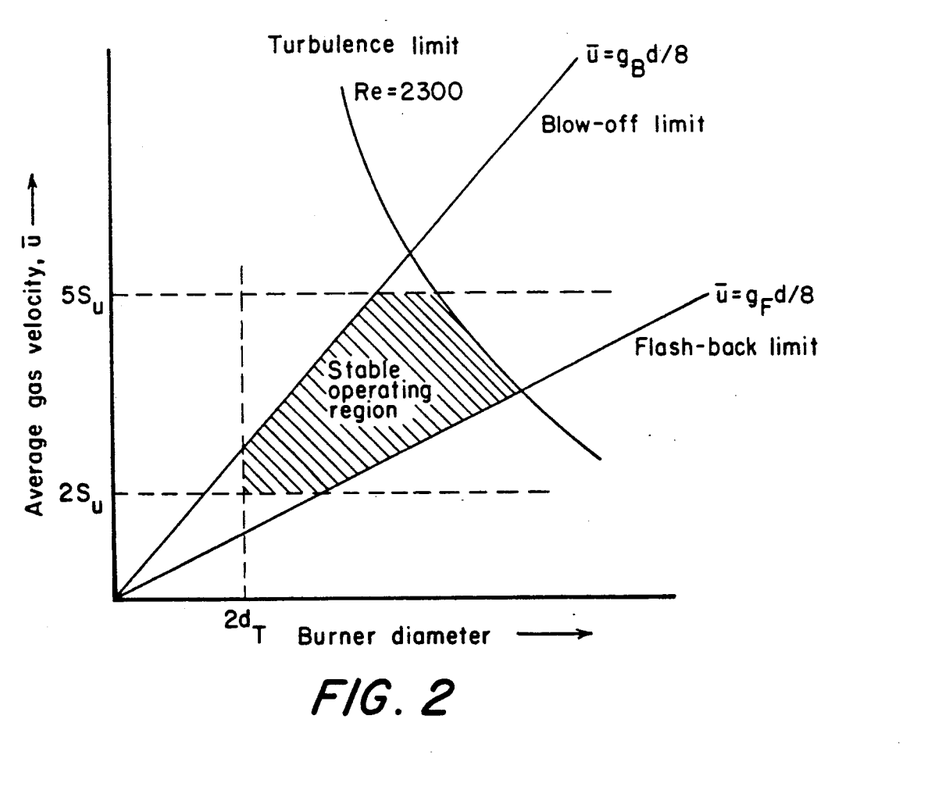
FIG. 2 illustrates typical operational regimes and limits for a torch burner, including the laminar regime, the turbulent regime and flashback and blow off limits.

In the process of the invention the torch is operated in a turbulent, rather than laminar mode. The different operational modes of a torch burner are shown in FIG. 2. The laminar and turbulent regimes are separated by a curve defined by the Reynolds number being equal to ~1200-2000. The regimes are bounded from above by the blow-off limit and from below by the flashback limit. The transition from laminar to turbulent flow usually occurs for Reynolds (Re) numbers of about 2200 (see R. B. Bird, W. E. Stewart, E. N. Lightfoot, "Transport Phenomena", pp. 153-156, John Wiley, 1960). For the purposes of the invention, the Reynolds number is defined as:

$$Re = <v>\rho d/\mu$$

where $<v>$ is the average velocity, $\rho$ is the density, d is the tube diameter of the torch, and $\mu$ is the viscosity. For Re<1200, the flow is always laminar. In the transition region also known as transition zone flow conditions, 1200<Re 2200, small random flow fluctuations tend to be damped out, but the flow is unstable to larger fluctuations. Abrupt switches from laminar to turbulent behavior are thus possible in this transition region.

While for laminar flames, the flame front is thin and conical or bell shaped, when a flame becomes turbulent, the center of the flame front blurs, but remains steady. This generally occurs when the Re for the flame is near 2200. The flame noise also begins to increase. With increased turbulence, the whole volume in which the primary combustion occurs becomes very thick and blurred; this region is called the "flame brush".

The temperature of the substrate may be controlled in a variety of ways including clamping the substrate to a heat sink and flowing cool gas over the bottom of the substrate or the apparatus on which it is mounted. In a preferred embodiment, the substrate is machined into a threaded rod, and the penetration of the rod into a water cooled metal mount is used to control the temperature. The threaded rod is typically made of Mo, but coatings (e.g. Si, TiC, Ta, etc.) can be applied to the surface of the rod, or other materials (e.g. diamond, BN, etc.) can be brazed or attached to the Mo.

In a combustion flame deposition, turbulence in the gas mixture can be produced by using diffusion or surface mixed flame techniques by preventing pre-mixing the fuel and oxidizer, usually oxygen, and mixing these components of the flame only when they arrive at the surface of the burner.

Turbulence in the gaseous mixture may also be generated using a flat flame burner operated with a sufficiently high Reynolds number. Types of flat flame burners include microtube, fritted plug, porous plug, etc., burners. Co-axial sheath flames may be needed to stabilize turbulent flames on flat flame burners. Sheath gas feeder systems can also be used to exclude nitrogen and oxygen from deposition processes in open air.

The mixture of gases can be made turbulent in CVD techniques other than combustion flame deposition. Some of these techniques include using a radio frequency (RF) plasma jet or a direct current (DC) plasma jet, so-called "plasma spraying guns". While the $O_2$ is not normally used to a great extent in plasma jet depositions, the inclusion of $O_2$ via the feedstock gases or via entrainment of room air enhances the effect of turbulence in the plasma jet depositions according to the present invention and provides diamond of improved quality.

Figure 7:
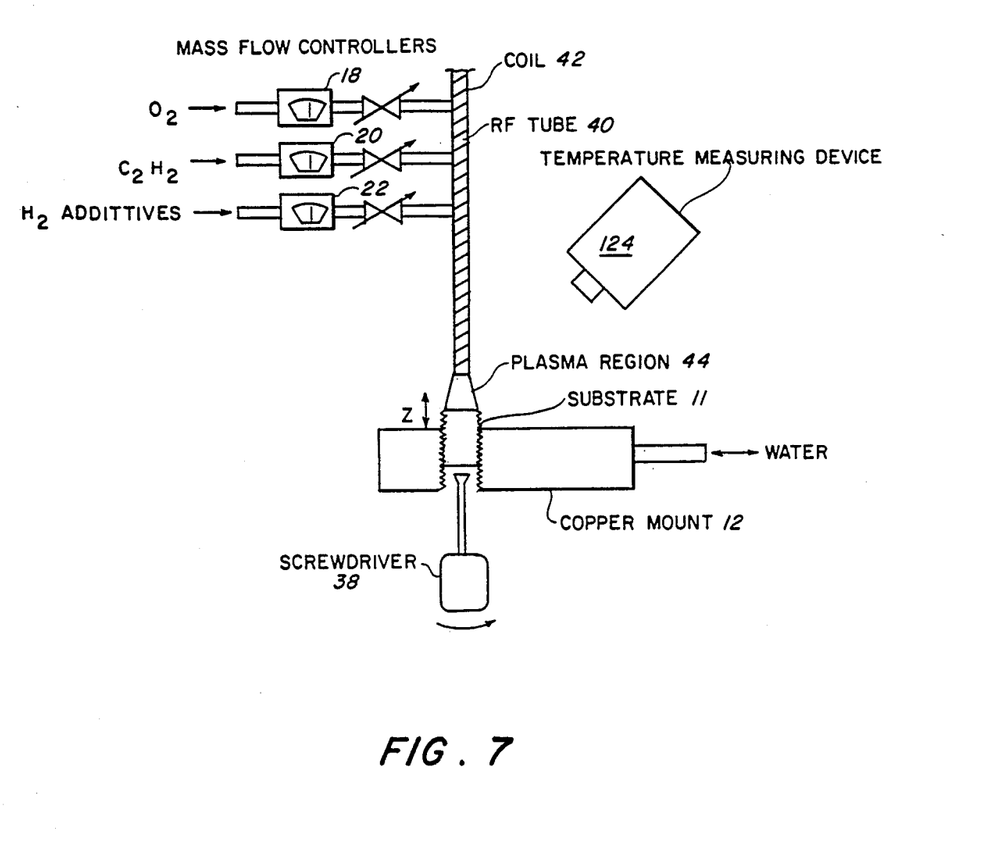
FIG. 7 illustrates in schematic form a radio frequency plasma jet deposition apparatus for practicing the process according to the invention.

An apparatus for using an RF plasma jet is illustrated in FIG. 7. The apparatus is similar to that for a combustion flame but includes a tube 40, preferably made of quartz, in place of the combustion flame nozzle. A copper RF coil 42 is wound around the tube 40 to generate RF waves which excite the gases in the tube 40 to form a plasma region 44 which deposits diamond on substrate 11. While the plasma region 44 is shown as existing outside the tube 40, in fact, the plasma region extends inside of RF tube 42. A temperature measuring device 124 is used to monitor the temperature of the plasma region 44, and of the substrate.

Detailed descriptions of RF plasma jet processes which may be modified to be used with the method of the invention are described in Matsumoto et al., "Synthesis of diamond films in a rf induction thermal plasma", Appl. Phys. Lett. 51 (10), 7 Sep. 1987 and M. A. Capelli, et al., "High Growth Rate Diamond Synthesis in a Large Area Atmospheric Pressure Inductively Coupled Plasma", preprint to be published in J. Matls. Research, November 1990, the entire contents and disclosures of which are hereby incorporated by reference.

Figure 8:
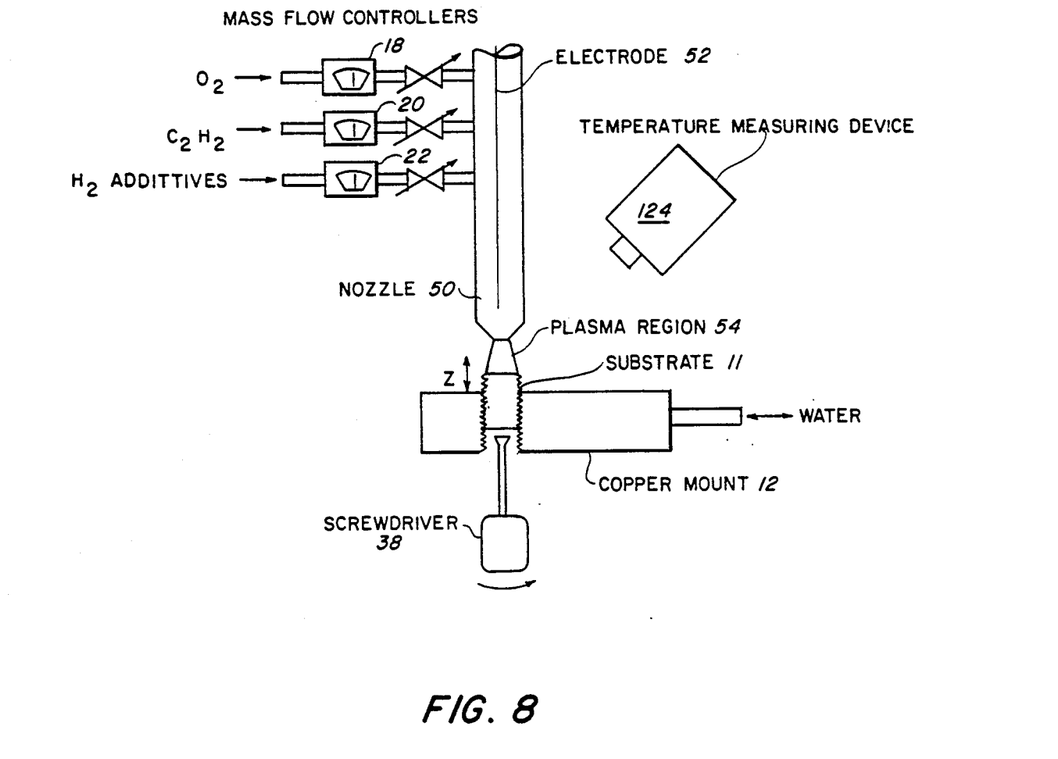
FIG. 8 illustrates in schematic form a direct current plasma jet apparatus for practicing the process according to the invention.

An apparatus for using a DC plasma jet is illustrated in FIG. 8. The apparatus is similar to that for an RF plasma jet but includes a nozzle 50 having an electrode 52 therein in place of RF tube 42. The electrode 52 is connected to a power source (not shown) and is oppositely charged relative to the nozzle 50 so that there is a discharge between the electrode 52 and the nozzle 50. This discharge causes the excitation of the gases in the nozzle 50 and the formation of a plasma region 54 which deposits diamond on the substrate 11. Generally, the diameter of nozzle 50 for a DC plasma jet apparatus is larger than the diameter of the nozzle for a combustion flame apparatus.

Detailed descriptions of DC plasma jet processes which may be modified to be used with the method of the invention are described in Ohtake et al. cited above and in Klocek et al., "CVD diamond growth by dc plasma torch", SPIE Proceedings Vol. 1325, 1990, the entire contents and disclosures of which are hereby incorporated by reference.

Turbulence can also be produced by aligning multiple gas streams so they interact to cause turbulence, by using a gas flow line having a roughened surface, or by incorporating a wire mesh in the gas flow lines which supply any of the gases.

Another technique which may be employed to create a turbulent flame is to use a linear burner run in either a premixed or a diffusion mode, with a sufficiently high Reynolds number. Linear burners have a rectangular or elongated flame cross section and are useful for continuous deposition processes. They are usually of the microtube type. In the case of a diffusion flame, the fuel and oxidizer are usually diluted with a rare gas such as argon, in order to prevent localized sooting.

The method of the invention may be practiced under various pressures, but preferably the combustion flame deposition or plasma deposition of diamond is performed in a low pressure chamber. CVD is preferably performed in a chamber near or below atmospheric pressure, because lower pressures expand the size of the plasma or combustion zone suitable for growing diamond and because low pressure chambers permit one to exclude nitrogen from the growth environment. The substrate used in the method of the invention may be any of the materials conventionally used for synthesis by low-pressure CVD. As concrete examples of the substrate, there may be cited shaped articles such as Si wafer, sintered SiC, granular SiC, SiN, W, WC, Mo, TiC, TiN, thermet, ultra-hard special tool steels, special tool steels, high-speed steel, and natural or synthetic diamond.

In order to coat large areas of a substrate, the reacted turbulent gases may be passed over the surface of a stationary substrate or the substrate may pass over a stationary reactive turbulent gas stream.

Preferably, the substrate is held at a temperature of about 300°–1700° C. Most preferably, the a diamond film is deposited onto a substrate held at 700°–1100° C., a temperature at which the diamond surface remains hydrogen terminated. If graphite nucleation is impeded, diamond growth can be observed at higher temperatures (e.g. 1100°–1700° C.) on Au-Ta braze coatings and on diamond seed crystals. The upper temperature limit for diamond-on-diamond growth is determined by the desorption of hydrogen and the stability of the diamond crystal, and may exceed 1700° C. if sufficient hydrogen flux is available.

Figure 3:
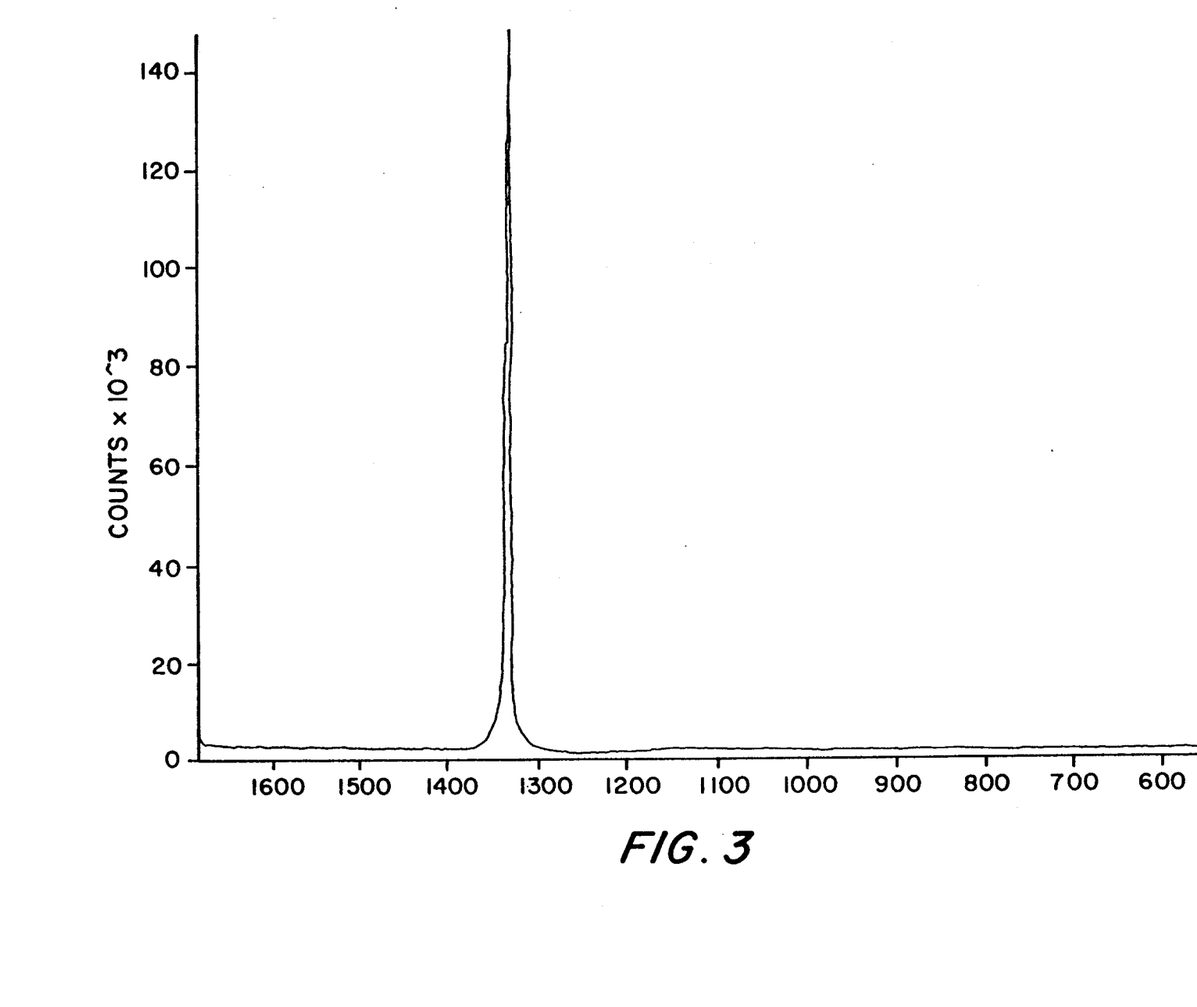
FIG. 3 shows a Raman spectra of a film grown according to the process of the invention.
Figure 4:
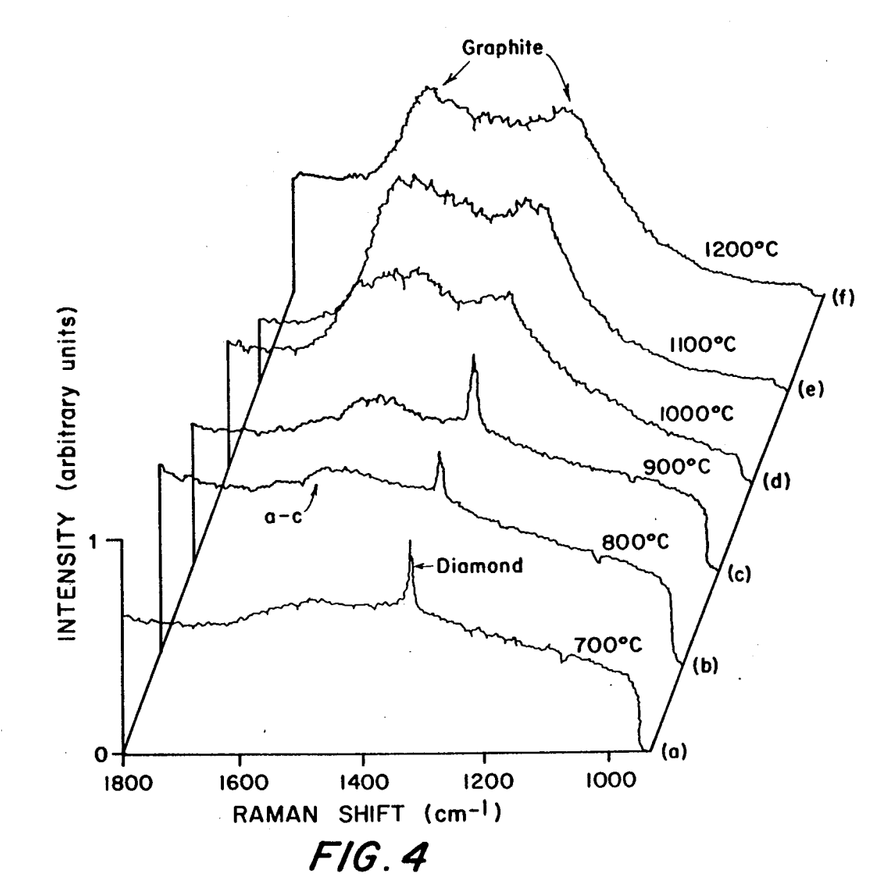
FIG. 4 shows the Raman spectra of diamond grown in a premixed, laminar oxygen-acetylene flame at substrate temperatures of 700° to 1200° C.
Figure 5:
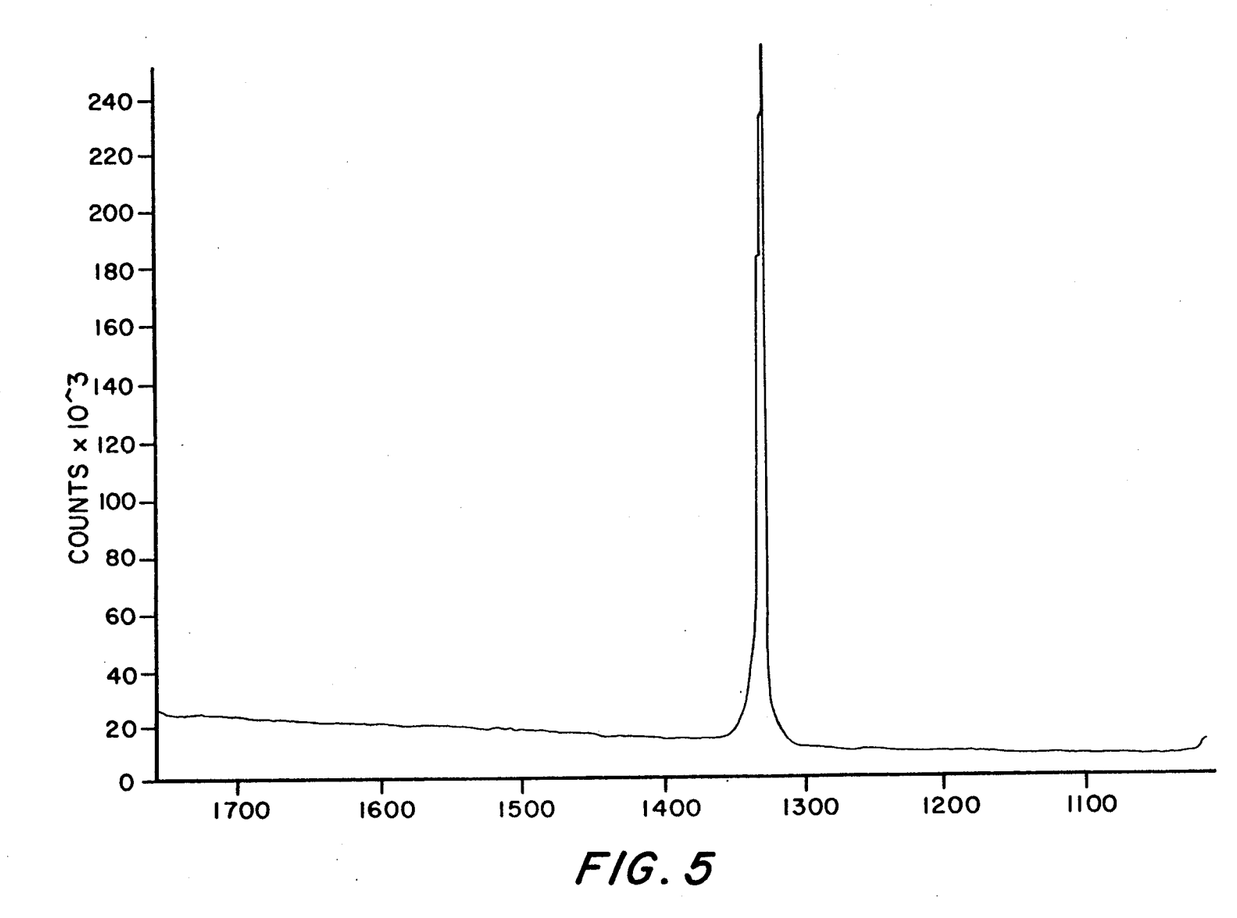
FIG. 5 shows a Raman spectra for a natural type 1b diamond.
Figure 6:
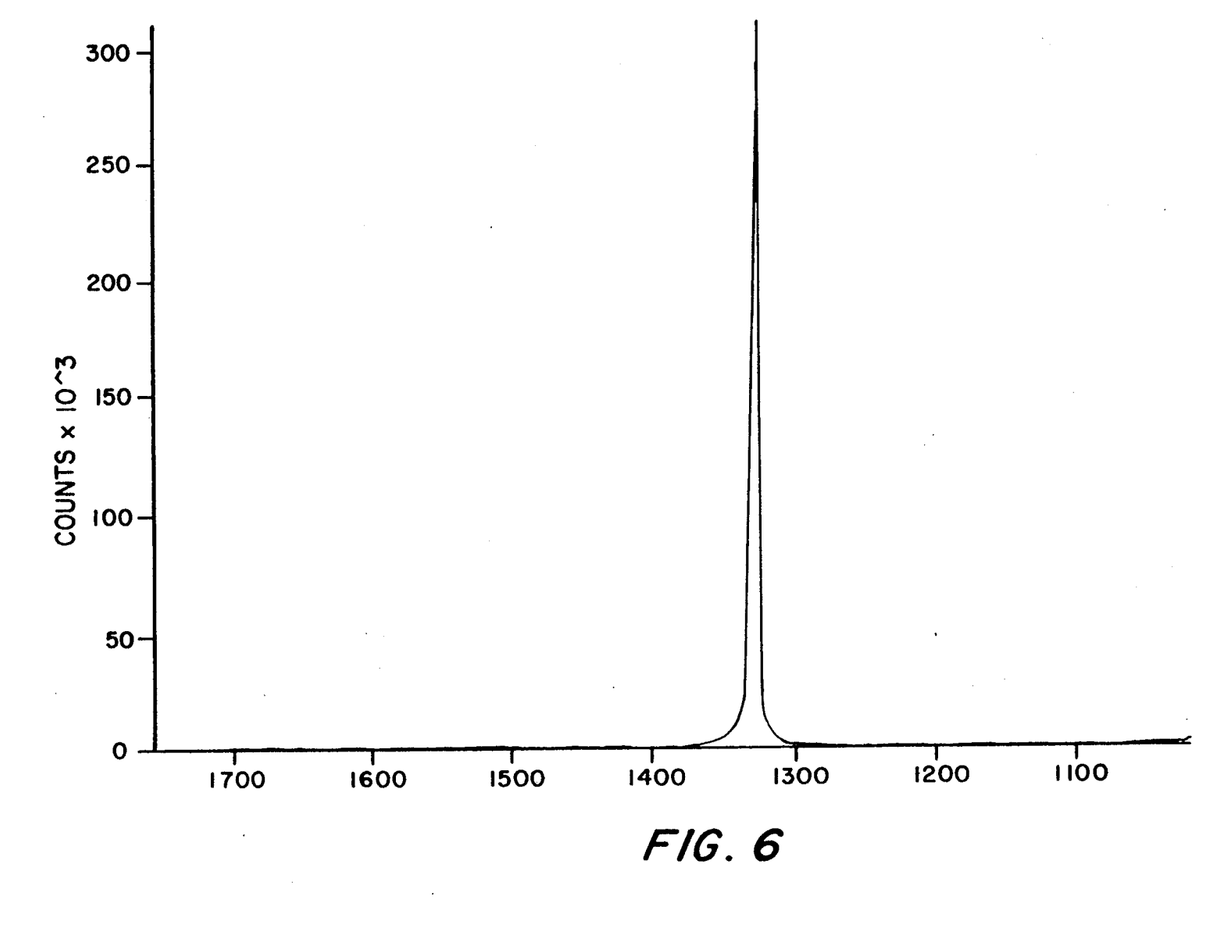
FIG. 6 shows a Raman spectra for a natural type IIa diamond.

The Raman spectra of a diamond film grown in a turbulent flame using the apparatus of FIG. 1 is shown in FIG. 3. In this spectra, there is a featureless fluorescence background and an extremely sharp peak due to diamond at 1332 cm$^{-1}$. For comparison, the Raman spectra of 5 samples grown in a laminar oxygen-acetylene flame at temperatures ranging from 700°–1200° C. is shown in FIG. 4. It should be noted that the presence of peaks due to amorphous carbon (broad peak around 1500 cm$^{-1}$) at most temperatures, and graphite (peaks at 1350 cm$^{-1}$ and 1580 cm$^{-1}$) at higher temperatures. A high fluorescence background is also observed at all temperatures. As a further comparison, a Raman spectra for a natural type 1b diamond (nitrogen in the 100–1000 ppm levels) is shown in FIG. 5, and that of a type IIa diamond (no nitrogen) in FIG. 6.

Having described the invention, the following examples are given to illustrate specific applications of the invention including the best mode now known to perform the invention. These specific examples are not intended to limit the scope of the invention described in this application.

EXAMPLES

The apparatus used for the carbon growth consisted of a commercial oxygen-acetylene brazing torch, fed by a gas mass flow control system, and a water cooled copper substrate mount. A two-color IR pyrometer (which measures 2.2 and 2.4 μm IR radiation) was used to monitor the substrate temperature during growth. The arrangement of these components is shown in FIG. 1.

High purity oxygen (99.99%) and acetylene (99.6%) were used as source gases, with the acetylene passed through an activated charcoal trap to remove residual acetone. For the growths performed, the ratio ($R_f$), of the flow rate of oxygen to the flow rate of acetylene was kept relatively constant an near 1.0–1.1. $R_f$ was chosen so that a small excess acetylene feather existed just beyond the primary flame front. The exact value of $R_f$ depends on the efficiency of mixing in the torch employed, the rate of room air entrainment, and the gas correction factors used in the mass flow controllers. Premixed oxygen-acetylene flames generated with a #4 brazing tip (1.85 mm tube diameter). The oxygen/acetylene flow ratio was kept constant at approximately 1.1 and the total flow was varied from 5–20 slm. At 5 slm, the flame is conical with a somewhat laminar flow. For a number 4 tip, the flame front zone broadens as total flow is increased to 10 slm, and develops a rounded end and very broad flame front at 20 slm.

The viscosity of a mixture of oxygen and acetylene was calculated with the semiempirical formula of Wilke, J. Chem. Phys. 18, 517 (1950) Assuming a temperature of 500K and a 1:1 mixture of oxygen:acetylene, the viscosity of the gases in the torch near the flame from was estimated as $2.2 \times 10^{-4}$ gm·cm/s. For the condition corresponding to the flames at 5, 10 and 20 slm, the Reynolds numbers were calculated as 1600, 2800 and 6600, respectively.

Figure 9:
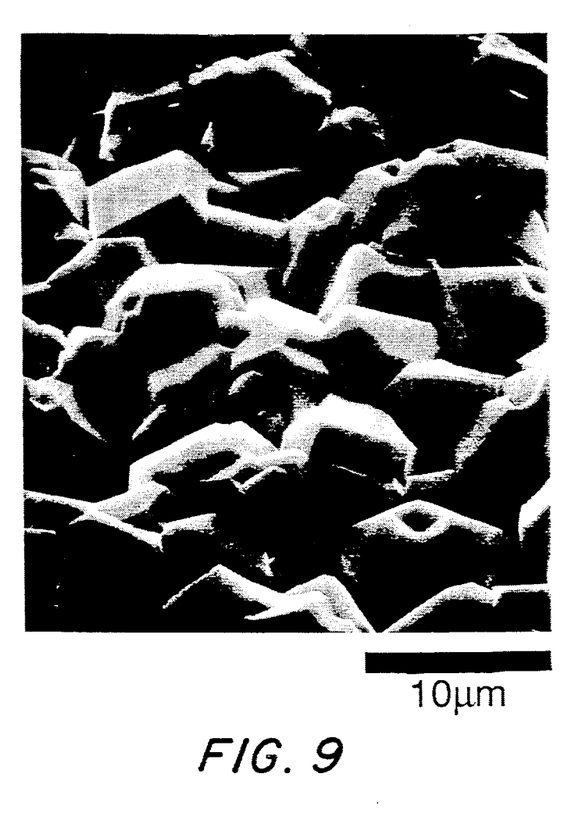
FIG. 9 is a photomicrograph of diamond grown in a turbulent flame according to the present invention.

The Raman spectra of a polycrystalline diamond film grown at $T_s = 900°$ C. is shown in FIG. 3, which was discussed above. Crystals grown under proper conditions in a turbulent flame are frequently transparent enough to allow one to image the Mo substrate through individual crystals with an optical microscope; thin films are whitish in color and sufficiently transparent to read newsprint through. A scanning electron micrograph (FIG. 9) shows that the surface of the film is composed of well facetted twinned crystallite with very little secondary nucleation on the crystal faces.

Figure 10:
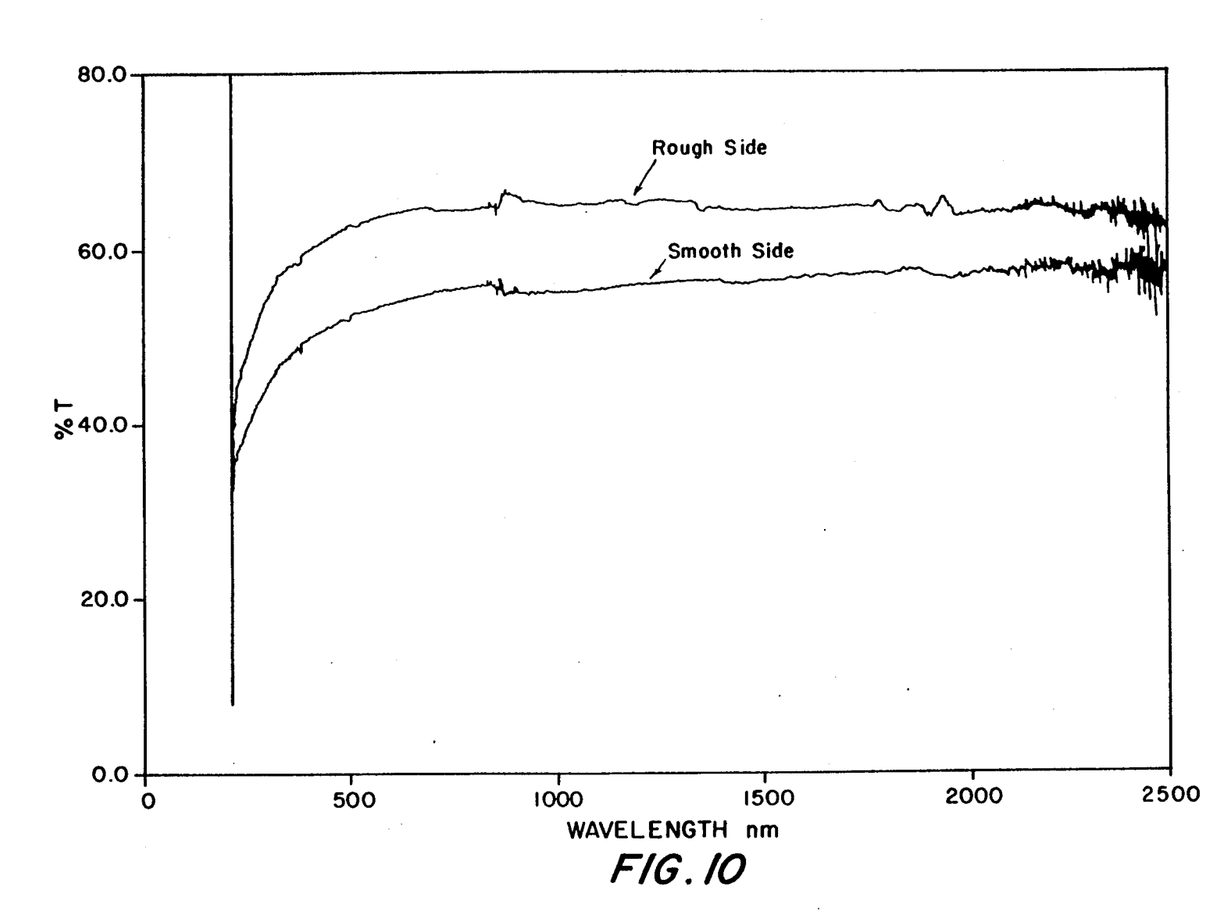
FIG. 10 shows the UV-visible and NIR hemispherical transmittance of an unpolished diamond film grown according to the present invention is and oxygen-acetylene flame.

The UV, visible and NIR hemispherical transmittance of a diamond film synthesized in a turbulent flame is shown in FIG. 10. Note the high transmittance thought the UV visible and NIR. the slightly higher transmittance for the rough side of the film, compared to the smooth substrate side, has been observed before and has been ascribed to total internal reflection effects.

While the FWHM (Full Width at Half Maximum) of synthetic diamond produced according to the present invention has not yet been determined, it is believed that diamonds made according to the present invention have a FWHM near that of natural diamond (2.2 cm$^{-1}$), for example, less than 4 cm$^{-1}$, typically less than 3.7 cm$^{-1}$ and perhaps less than 3.5 cm$^{-1}$ or 3 cm$^{-1}$. Also, microcrystals according to the present invention are microscopically transparent or essentially so. Additionally, it may be possible, using the method of the present invention, to produce macroscopic crystals.

It will be understood by those skilled in the art that although the invention has been described relative to exemplary embodiments thereof, variations and modifications can be effected in these embodiments without departing from the scope and spirit of the invention.

What is claimed is:

1. A method for synthesizing diamond comprising the steps of:

flowing together a gaseous carbon source and a gaseous hydrogen source to form a flow of a gaseous mixture, said flow of said gaseous mixture being under turbulent flow conditions or under transition zone flow conditions;

exciting the flow of said gaseous mixture to form a gaseous flow of a reactive species, said gaseous flow of said reactive species being under turbulent flow conditions or under transition zone flow conditions;

reacting the gaseous flow of said reactive species to form a gaseous flow of a deposition species, said gaseous flow of said deposition species being under turbulent flow conditions or under transition zone flow conditions;

mounting a substrate for deposition of diamond to a mount including means for cooling said substrate independently of the temperature of said gaseous flow of said deposition species;

disposing said mounted substrate in the gaseous flow of said deposition species; and maintaining the substrate at a temperature for the deposition of diamond, thereby inducing deposition of diamond on the substrate.

2. The method of claim 1, wherein the gas flow in the reactive species has a Reynolds number of at least about 2200.

3. The method of claim 1, further comprising flowing together an oxidizer with the carbon source and the hydrogen source to form the gaseous mixture, and the reactive species comprises a combustion flame formed by flowing the gaseous mixture in a burner, wherein said deposition of diamond is conducted at about atmospheric pressure.

4. The method of claim 3, wherein the combustion flame has a boundary layer at the substrate which is about 1 to about 10 μm thick.

5. The method of claim 3, wherein the combustion flame is a diffusion flame and is controlled by mixing the carbon source and the oxidizer at the surface of the burner.

6. The method of claim 3, wherein the combustion flame is generated by a flat flame burner selected from the group consisting of microtube burners, fritted plug burners, and porous plug burners.

7. The method of claim 3, wherein the carbon source and oxidizer flow to the gaseous mixture in multiple interacting gas streams and the gaseous mixture is formed by aligning the streams together.

8. The method of claim 3, wherein the carbon source and oxidizer are fed into the gaseous mixture in gas streams and the gas streams pass over roughened surfaces to cause turbulence in the combustion flame.

9. The method of claim 3, wherein the carbon source material and the oxidizer are mixed to form a single mixed gas stream and the gaseous mixture is formed by causing the mixed gas stream to pass through a wire mesh.

10. The method of claim 1, wherein the gaseous mixture is excited by a radio frequency plasma jet to form said flow of said reactive species, and wherein said deposition occurs at about atmospheric pressure.

11. The method of claim 10, wherein the carbon source and hydrogen source flow to the gaseous mixture in gas streams and the gaseous mixture is formed by aligning the streams of the carbon source and the hydrogen source to interact and cause turbulence.

12. The method of claim 10, wherein the carbon source and hydrogen source flow to the gaseous mixture in gas streams and the gas streams pass over roughened surfaces to cause turbulence in the gaseous mixture.

13. The method of claim 10 wherein the carbon source and hydrogen source flow to the gaseous mixture in gas streams and the gas streams pass through a wire mesh to cause turbulence in the gaseous mixture.

14. The method of claim 1, wherein the gaseous mixture is excited by a DC plasma jet to form said flow of said reactive species, and wherein said deposition occurs at about atmospheric pressure.

15. The method of claim 14, wherein the carbon source and hydrogen source flow to the gaseous mixture in gas streams and the gaseous mixture is formed by aligning the streams to interact and cause turbulence.

16. The method of claim 14, wherein the carbon source and hydrogen source flow to the gaseous mixture in gas streams and the gas streams pass over roughened surfaces to cause turbulence in the gaseous mixture.

17. The method of claim 14, wherein the carbon source and hydrogen source flow to the gaseous mixture in gas streams and the gas streams pass through a wire mesh to cause turbulence in the gaseous mixture.

18. The method of claim 1, wherein the substrate comprises a diamond crystal and the substrate is maintained at a temperature between about 300° and 1700° C.

19. The method of claim 18, wherein the carbon source is a hydrocarbon isotopically enriched with $^{12}C$.

20. The method of claim 1, wherein the substrate is maintained at a temperature at which the diamond surface remains hydrogen terminated.

21. A synthetic diamond which is essentially transparent and has a Full Width at Half Maximum of less than 3.7 cm$^{-1}$.

22. A synthetic diamond which is essentially transparent and has a Full Width at Half Maximum of less than 3.5 cm$^{-1}$.

* * * * *

UNITED STATES PATENT AND TRADEMARK OFFICE
CERTIFICATE OF CORRECTION

PATENT NO. : 5,174,983

DATED : December 29, 1992

INVENTOR(S) : Keith A. Snail

It is certified that error appears in the above-identified patent and that said Letters Patent is hereby corrected as shown below:

Title page, Item No. 56 Attorney, Agent or Firm was omitted, please add -- Thomas E. McDonnell and Barry A. Edelberg --

Signed and Sealed this

Twenty-eighth Day of December, 1993

*Attest:*

BRUCE LEHMAN

*Attesting Officer*  Commissioner of Patents and Trademarks